(12) United States Patent
Weller

(10) Patent No.: US 6,820,027 B2
(45) Date of Patent: Nov. 16, 2004

(54) SYSTEM AND METHOD FOR GENERATING A SHMOO PLOT BY AVOIDING TESTING IN FAILING REGIONS

(75) Inventor: Christopher Todd Weller, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 50 days.

(21) Appl. No.: 10/285,774

(22) Filed: Nov. 1, 2002

(65) Prior Publication Data
US 2004/0088131 A1 May 6, 2004

(51) Int. Cl.⁷ .............................................. G06F 15/04
(52) U.S. Cl. ...................... 702/117; 702/118; 702/120; 702/121; 702/123
(58) Field of Search ............................. 702/36, 81, 85, 702/106, 117, 121, 123, 159, 190; 435/6, 285.2; 455/252.1; 382/100; 600/544

(56) References Cited

U.S. PATENT DOCUMENTS 5,484,994 A * 1/1996 Roustaei ................ 235/462.25
5,828,067 A * 10/1998 Rushbrooke et al. .. 250/370.11
6,023,777 A    2/2000 Knaack
6,079,038 A    6/2000 Huston et al.
6,343,339 B1 * 1/2002 Daynes ....................... 710/200
6,347,163 B2 * 2/2002 Roustaei ..................... 382/324
6,418,387 B1   7/2002 Carney

* cited by examiner

Primary Examiner—Felix Suarez

(57) ABSTRACT

A method of testing an electrical device to determine a range of combinations of values of N variable operating parameters for which the device functions properly is described. In one embodiment, The method comprises defining a plot region comprising a plurality of operating points each corresponding to a particular combination of values of the N variable operating parameters, selecting an operating point within the plot region, testing the device using the combination of values of the N variable operating parameters corresponding to the selected operating point, and if the device functions in a first manner at the selected operating point, adding all operating points of the plot region having a first relationship with respect to the selected operating point to a list of operating points to be tested.

34 Claims, 4 Drawing Sheets

| | 1.00 | 1.10 | 1.20 | 1.30 | 1.40 | 1.50 | 1.60 | 1.70 | 1.80 | 1.90 | 2.00 | 2.10 | 2.20 |
|---|---|---|---|---|---|---|---|---|---|---|---|---|---|
| 680 | XXX | XXX | XXX | --- | --- | --- | --- | --- | --- | --- | XXX | XXX | XXX |
| 710 | XXX | XXX | XXX | --- | --- | --- | --- | --- | --- | --- | XXX | XXX | XXX |
| 740 | XXX | XXX | XXX | --- | --- | --- | --- | --- | --- | --- | XXX | XXX | XXX |
| 770 | XXX | XXX | XXX | XXX | --- | --- | --- | --- | --- | --- | XXX | XXX | XXX |
| 800 | | XXX | XXX | XXX | --- | --- | --- | --- | --- | --- | XXX | XXX | XXX |
| 830 | | XXX | XXX | XXX | XXX | --- | --- | --- | --- | --- | XXX | XXX | XXX |
| 860 | | | XXX | XXX | XXX | --- | --- | --- | --- | --- | XXX | XXX | XXX |
| 890 | | | | XXX | XXX | XXX | --- | --- | --- | --- | XXX | XXX | XXX |
| 920 | | | | | XXX | XXX | XXX | --- | --- | --- | XXX | XXX | XXX |
| 950 | | | | | | | XXX | XXX | XXX | --- | XXX | XXX | XXX |
| 980 | | | | | | | | XXX | XXX | XXX | XXX | XXX | |
| 1010 | | | | | | | | | XXX | XXX | XXX | | |
| 1040 | | | | | | | | | | XXX | | | |

KEY:
XXX = fail
--- = pass

FIG. 5

SYSTEM AND METHOD FOR GENERATING A SHMOO PLOT BY AVOIDING TESTING IN FAILING REGIONS

CROSS-REFERENCE TO RELATED APPLICATIONS

This application is related to U.S. patent application Ser. No.: 10/226,679; filed Nov. 1, 2002. entitled SYSTEM AND METHOD FOR GENERATING A SHMOO PLOT BY VARYING THE RESOLUTION THEREOF and U.S. patent application Ser. No.: 10/285,785; filed Nov. 1. 2002. entitled SYSTEM AND METHOD FOR GENERATING A SHMOO PLOT BY TRACKING THE EDGE OF THE PASSING REGION.

BACKGROUND OF THE INVENTION

1. Technical Field of the Invention

The present invention generally relates to methods and systems for generating parametric test data for electrical devices. More particularly, and not by way of any limitation, the present invention is directed to method and system for generating a shmoo plot representative of such parametric data.

2. Description of Related Art

It is often necessary to characterize the performance of an electrical device with respect to certain operational parameters of the device. This characterization may be referred to as "parametric testing". One method by which to measure the performance of a device is on a pass/fail basis. A complete parametric test would provide a pass/fail result for every possible combination of all values of the operational parameters in question. This type of test provides users of the device information as to how the device will perform over a broad range of test conditions.

A shmoo plot is a graphical representation of the ability of an electrical device to operate properly in response to various combinations of values of two variable operating parameters, or "test conditions". For example, an integrated circuit ("IC") device might be repeatedly tested using different combinations of supply voltage and CPU clock signal frequency to determine the various test conditions in which the IC operates properly.

FIG. 1 illustrates a conventional shmoo plot 100. Each of the X- and Y-axes, designated 102(X) and 102(Y), respectively, represents the value of a test operating parameter. Continuing with the IC example set forth above, the X-axis 102(X) represents the value of supply voltage (Vcc) in units of volts ("V") and the Y-axis 102(Y) represents CPU clock signal frequency in units of megahertz ("Mhz"). To generate sufficient data to produce a useful shmoo plot, a device must be tested at an adequate number of combinations of X and Y operating parameter values within a range of interest bounded by Xmin, Xmax, Ymin, and Ymax, with some predetermined resolution in the X and Y interval size. Again, returning to the IC example, as illustrated in FIG. 1, Xmin and Xmax are 1.0V and 2.1V, respectively, while Ymin and Ymax are 470 Mhz and 1100 Mhz, respectively. The X and Y interval sizes are 0.1V and 30 Mhz, respectively.

A "pass" symbol, represented in FIG. 1 by the symbol "---", is plotted when the device passes a test performed under the combination of operating parameters identified by the corresponding cartesian (X, Y) coordinate pair. Similarly, a "fail" symbol, represented in FIG. 1 by the symbol "xxx", is plotted when the device fails a test performed under the combination of operating parameters identified by the corresponding cartesian (X, Y) coordinate pair. In the IC example used herein, the IC is deemed to have "passed" if it functions correctly under a given set of test conditions.

As evidenced by the shmoo plot 100, shmoo plots provide a clear depiction of the operational limits of a device under various test conditions. A passing region 104 comprises the collection of passing points. A failing region 106 comprises the collection of failing points. An observer can easily note where the performance of the device transitions from the passing region 104 to the failing region 106 as the operating parameters are varied. It will be recognized, however, that a significant amount of time is required to perform the tests that form each of the individual array elements of a shmoo plot. In a simple 16×16 shmoo plot, assuming each test requires 100 μs to perform, the entire shmoo plot would require 16×16×100 μs, or 25.6 ms, to complete. Realistically, each operating parameter will be swept over a range of 100 values and each individual test could take on the order of a second to complete. Accordingly, a shmoo plot corresponding to such a parametric test would take nearly three hours to complete.

SUMMARY OF THE INVENTION

Accordingly, the present invention advantageously provides a method and system for more rapidly generating a shmoo plot by avoiding testing in failing regions and "flood-filling" passing regions.

One embodiment is a method of testing an electrical device to determine a range of combinations of values of N variable operating parameters for which the device functions properly. The method comprises defining a plot region comprising a plurality of operating points each corresponding to a particular combination of values of the N variable operating parameters, selecting an operating point within the plot region, testing the device using the combination of values of the N variable operating parameters corresponding to the selected operating point, and if the device functions in a first manner at the selected operating point, adding all operating points of the plot region having a first relationship with respect to the selected operating point to a list of operating points to be tested.

BRIEF DESCRIPTION OF THE DRAWINGS

A more complete understanding of the present invention may be had by reference to the following Detailed Description when taken in conjunction with the accompanying drawings wherein:

FIG. 5 illustrates a shmoo plot generated in accordance with the embodiment illustrated in FIG. 2.

DETAILED DESCRIPTION OF THE DRAWINGS

Figure 1:
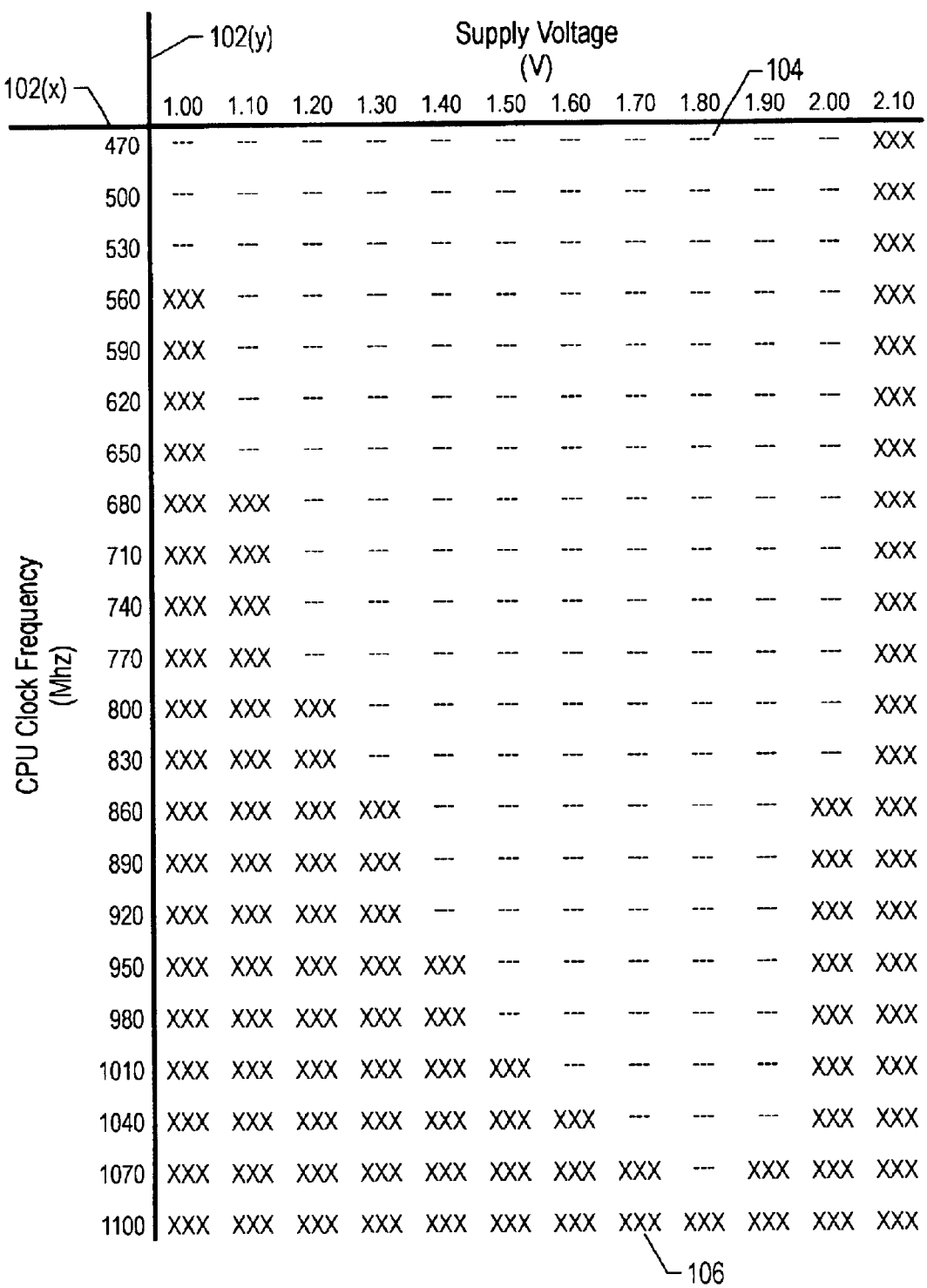
FIG. 1 illustrates a shmoo plot in accordance with the prior art.

In the drawings, like or similar elements are designated with identical reference numerals throughout the several views thereof, and the various elements depicted are not necessarily drawn to scale.

Figure 2:
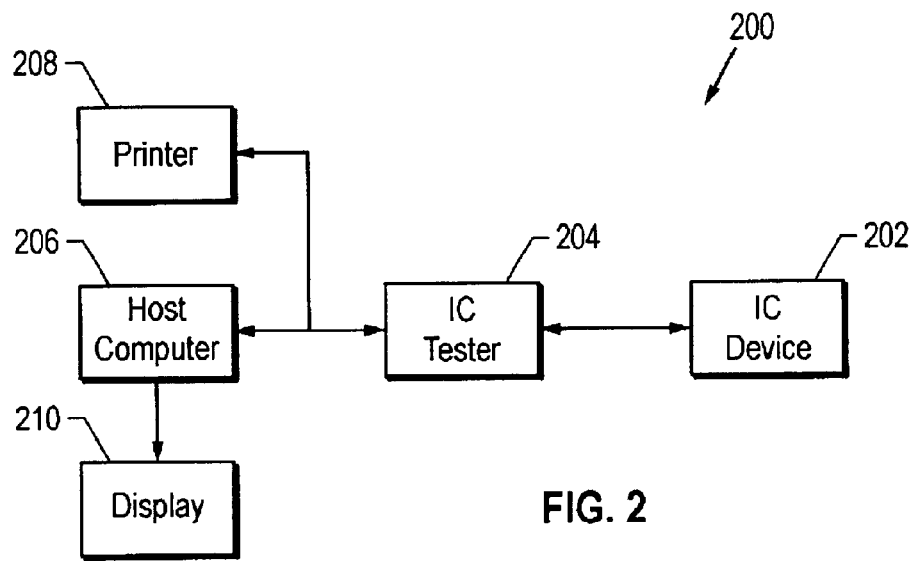
FIG. 2 is a block diagram of a system for generating a shmoo plot in accordance with one embodiment.

FIG. 2 is a block diagram of a system 200 for generating a shmoo plot in accordance with one embodiment. The system 200 produces a shmoo plot indicating a range of values of a pair of operating parameters under which an IC device 202 can pass a predetermined test. The system 200 includes a conventional circuit tester 204 configurable by a host computer 206 via data and control signals sent to the tester 204. As will be recognized by one of ordinary skill in the art, the host computer 206 executes computer program instructions that dictate the operation thereof in accordance with the embodiments described herein. In accordance with one embodiment, the host computer 206 informs the tester 204 as to the value to which to set various operating parameters of the IC device 202. Once the tester 204 tests the IC device 202 under the prescribed operating parameters, it provides to the host computer 206 pass/fail data indicative of the performance of the IC device 202.

The host computer 206 utilizes the pass/fail data from the tester 204 to generate a shmoo plot, such as the one illustrated in FIG. 1, indicative of a performance envelope of the IC device 202. In one embodiment, the shmoo plot can be printed via a printer 208 and/or displayed on a display device 210 connected to the host computer 206.

In accordance with one embodiment, rather than configuring the tester 204 to test the IC device 202 for every combination of X and Y operating parameters between the specified maxima and minima, the host computer 206 configures the tester 204 to test the IC device 202 only at certain operating points, as described in detail below.

Figure 3:
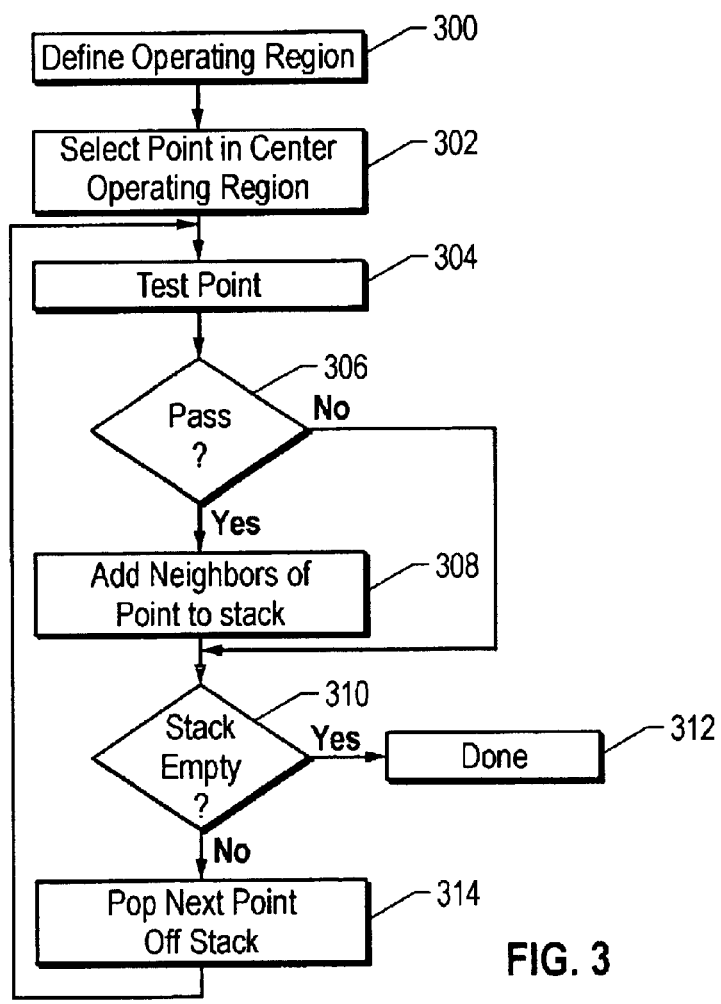
FIG. 3 is a flowchart illustrating operation of one embodiment of the present invention for generating a shmoo plot.

FIG. 3 is a flowchart of a method of operating the tester 204 to generate a shmoo plot by avoiding testing in failing regions in accordance with one embodiment. In block 300, an operating region for the shmoo plot, including intervals at which the two operating parameters will be tested, is defined. For example, in the shmoo plot illustrated in FIG. 1, the operating region is defined by Xmin=1.0 V, Xmax=2.2 V, Ymin=680 Mhz, and Ymax=1040 Mhz, and X and Y operating interval sizes of 0.1 V and 30 Mhz, respectively.

Figure 4:
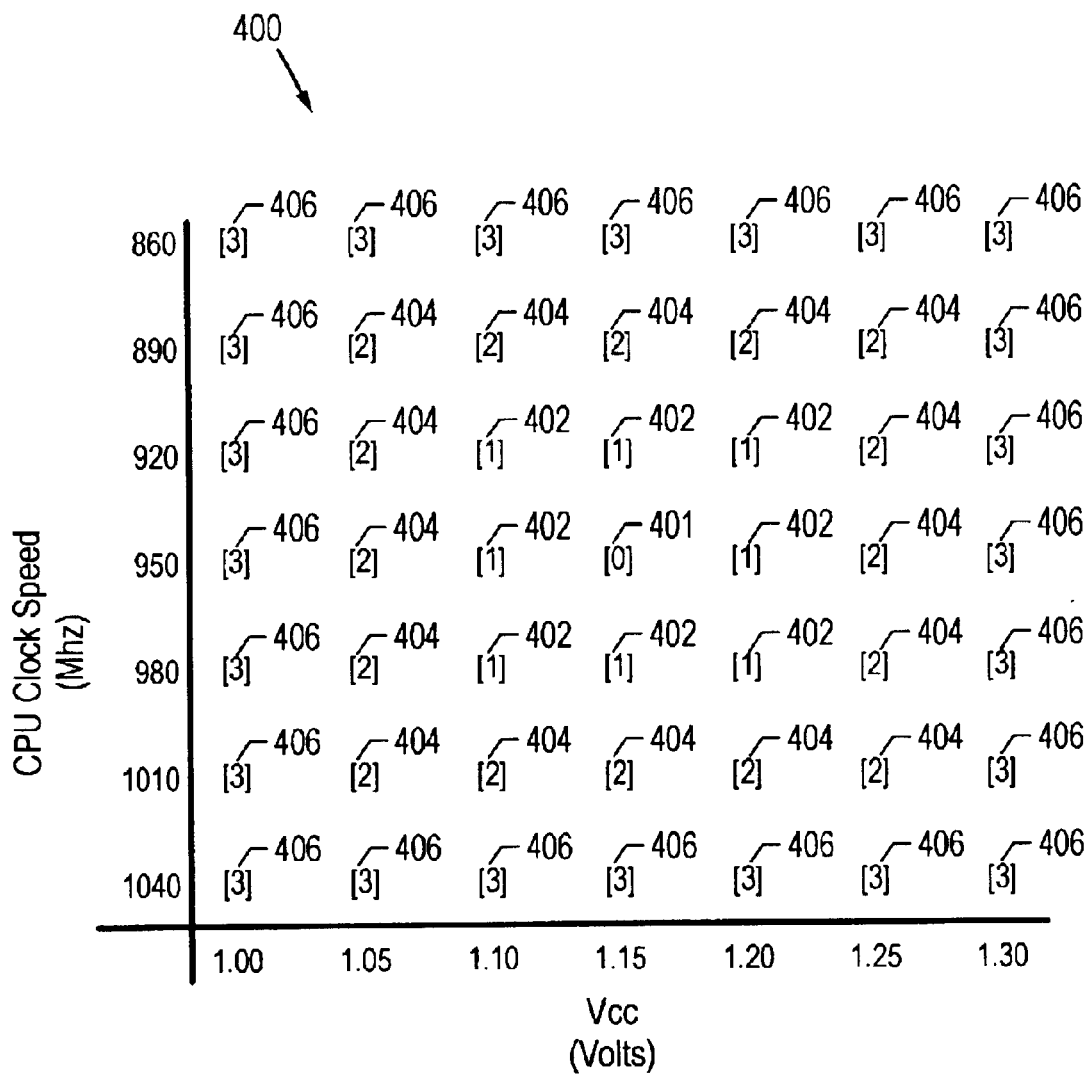
FIG. 4 illustrates the concept of failure depth in accordance with one embodiment.

In block 302, an operating point near the center of the defined operating region is selected. In block 304, the tester 204 is caused to test the IC device 202 using the coordinates of the point selected in block 302 as operating parameters. In block 306, the tester determines whether the device 202 has passed or failed at the selected operating point. If the device 202 has passed, execution proceeds to block 308, in which all points adjacent to the just-tested point, also referred to as the "neighbors" thereof, are added to a stack maintained, for example, in the host computer 206. Referring briefly to FIG. 4, it will be recognized that each point 402 is adjacent to, or a neighbor of, a point 401. Execution then proceeds to block 310. As used herein, "adjacent points" includes all points that border a particular point. In other words, using a map analogy, all points that border a particular point to the immediate north, south, east, and west, as well as all points that border the particular point to the immediate northeast, northwest, southeast, and southwest, are considered neighbors of that particular point.

Returning to the flow chart, if a determination is made in block 306 that the device has failed, execution proceeds immediately to block 310. In block 310, a determination is made whether the stack is empty. If so, execution terminates in block 312; otherwise, execution proceeds to block 314, in which the next point is popped off the stack, and then returns to block 304.

In an embodiment, points are tested only once; therefore, with respect to each point added to the stack, a determination will be made, either prior to adding the point to the stack or upon popping the point off the stack, whether the point has previously been tested. In this regard, it is recognized that a list of points that have been tested will be maintained by the host computer 206 for this purpose.

In an alternative embodiment, a queue data structure may be used instead of a stack; however, the method illustrated in FIG. 3 will perform noticeably differently. In particular, a queue(first in, last out) implementation will spread out gradually from the initial point, while a stack (first in, first out) implementation will wind its way around the shmoo like a worm until every passing point has been filled, or "flooded". In either case, exactly the same points are tested; it is only the order in which the points are tested that differs.

In yet another alternative embodiment, a maximum depth that the shmoo will move into the failing region before terminating may be specified. In this alternative embodiment, the neighbors of failing points are also added to the stack but are tagged with a "failure depth". In general, the failure depth of a failing point indicates how many previous points in the direct lineage of the failing point have failed. For example, a point that was either selected as the initial point or was a neighbor of a passing point has a failure depth of 0. The neighbor of a failing point with a failure depth of 0 is assigned a failure depth of 1. Similarly, the neighbor of a failing point with a failure depth of 1 is assigned a failure depth of 2, and so on. This will continue until the maximum failure depth is reached. A point to which the maximum failure depth has been assigned is not allowed to place any of its neighbors on the stack if it fails.

The concept of failure depth is illustrated in FIG. 4, which depicts a partial shmoo plot 400. A failure depth assigned to each point is indicated in brackets. It will be assumed for the sake of example that all points 401, 402, 404, and 406 illustrated in FIG. 4 are failing points. Accordingly, the initial point 401 is assigned a failure depth of 0. Each point 402 comprising a neighbor of the point 401 is assigned a failure depth of 1, meaning that a single point (point 401) in the direct lineage of each point 402 has failed. Each previously untested point 404 comprising a neighbor of each point 402 is assigned a failure depth of 2, meaning that two points (one of the points 402 and the point 401) in the direct lineage of each point 404 have failed. Each previously untested point 406 comprising a neighbor of each point 404 is assigned a failure depth of 3, meaning that three points (one of the points 404, one of the points 402, and the point 401) in the direct lineage of each point 406 have failed, and so on.

FIG. 5 illustrates a shmoo plot 500 generated in accordance with the embodiments described above. A maximum failure depth of 3 was used in generating the shmoo plot 500. As illustrated in FIG. 5, the shmoo plot 500 includes a passing region 502, which has been completely filled, or flooded, and a failing region 504, which has been filled only to the maximum failure depth.

In yet another alternative embodiment, a failing region, rather than a passing region, could be flooded in the manner described above with reference to FIG. 3, in which case the passing region would be avoided and a "pass depth", rather than a failure depth, could be specified.

It will be recognized that the techniques set forth herein are applicable to N-dimensional shmoos, even in cases in which N is greater than 2. For example, in the case in which N is equal to three, the set of neighbors of a point would include all points that border on the point in all directions. In other words, the set of neighbors would include all 26 points that form the cube that directly surrounds the point of interest.

An implementation of the invention described herein thus provides a method and system for more rapidly generating a shmoo plot representative of parametric test data with respect to an electrical device. It is believed that the operation and construction of the present invention will be apparent from the foregoing Detailed Description.

Although the invention has been described with reference to certain illustrations, it is to be understood that the forms of the invention shown and described are to be treated as exemplary embodiments only. Various changes, substitutions and modifications can be realized without departing from the spirit and scope of the invention as defined by the appended claims.

What is claimed is:

1. A method of testing an electrical device to determine a range of combinations of values of N variable operating parameters for which the device functions properly, the method comprising:

defining a plot region comprising a plurality of operating points each corresponding to a particular combination of values of the N variable operating parameters;

selecting an operating point within the plot region;

testing the device using the combination of values of the N variable operating parameters corresponding to the selected operating point; and if the device functions in a first manner at the selected operating point, adding all operating points of the plot region having a first relationship with respect to the selected operating point to a list of operating points to be tested.

2. The method of claim 1 further comprising:

selecting an operating point from the list of operating points; and repeating the testing, conditional adding, and selecting for all points of the list of operating points.

3. The method of claim 1 further comprising:

initializing a number associated with each operating point of the defined plot region to zero;

if the device functions in other than the first manner at the selected operating point:

incrementing the number associated with the selected operating point;

identifying all operating points of the plot region having a first relationship with respect to the selected operating point;

for each of the identified operating points, setting a value of the number associated therewith to a value of the number associated with the selected operating point; and adding the identified operating points to the list of operating points to be tested.

4. The method of claim 3 wherein the adding all operating points of the plot region having a first relationship with respect to the selected operating point comprises adding all operating points of the plot region adjacent to the selected operating point and wherein the identifying all operating points of the plot region having a first relationship with respect to the selected operating point comprises identifying all operating points of the plot region adjacent to the selected operating point.

5. The method of claim 3 further comprising, if the device functions in other than the first manner at the selected operating point:

prior to incrementing, determining whether the number associated with the selected operating point is equal to a predetermined maximum number; and if the number associated with the selected operating point is equal to the predetermined maximum number, skipping the identifying, assigning, and adding with respect to the selected operating point.

6. The method of claim 5 wherein N is two.

7. The method of claim 1 wherein the first manner of functioning comprises proper operation of the device.

8. The method of claim 1 further comprising:

prior to the testing, determining whether the device has previously been tested at the selected operating point; and if the device has previously been tested at the selected operating point, omitting further testing of the device at the selected operating point.

9. The method of claim 1, wherein the list of operating points to be tested is implemented as a first-in, last-out queue.

10. The method of claim 1 wherein the list of operating points to be tested is implemented as a first-in, first-out stack.

11. The method of claim 1 further comprising plotting results of the testing.

12. A system for testing an electrical device with respect to various combinations of values of N variable operating parameters to determine a range of combinations of values of the N variable operating parameters, for which the device functions properly, wherein each combination of the values of the N variable operating parameter comprises an operating point and the collection of operating points comprises a plot region, the system comprising:

means for testing the electrical device using the combination of values of the N variable operating parameters corresponding to a selected operating point; and means for adding all operating points of the plot region having a first relationship with respect to the selected operating point to a list of operating points to be tested responsive to the electrical device functioning in a first manner at the selected operating point.

13. The system of claim 12 further comprising means for causing the testing, conditional adding, and selecting to be repeated for all points of the list of operating points.

14. The system of claim 12 further comprising:

means for initializing a number associated with each operating point of the defined plot region to zeros; and means responsive to the electrical device functioning in other than the first manner at the selected operating point for incrementing the number associated with the selected operating point; identifying all operating points of the plot region adjacent to the selected operating point; for each of the identified operating points, setting a value of the number associated therewith to a value of the number associated with the selected operating point; and adding the identified operating points to the list of operating points to be tested.

15. The system of claim 14 further comprising means responsive to the electrical device functioning in other than the first manner at the selected operating point for, prior to incrementing, determining whether the number associated with the selected operating point is equal to a predetermined maximum number; and if the number associated with the selected operating point is equal to the predetermined maximum number, skipping the identifying, assigning, and adding with respect to the selected operating point.

16. The system of claim 12 wherein the means for adding all operating points having a first relationship with respect to the selected operating point comprises means for adding all operating points adjacent to the selected operating point.

17. The system of claim 12 wherein the first manner of functioning comprises proper operation of the electrical device.

18. The system of claim 12 further comprising means for determining whether the electrical device has previously been tested at the selected operating point prior to the testing and means responsive to the electrical device having previously been tested at the selected operating point for omitting further testing of the electrical device at the selected operating point.

19. The system of claim 12 wherein the list of operating points to be tested is implemented as a data structure selected from a group consisting of a first-in, last-out queue and a first-in, first-out stack.

20. The system of claim 12 further comprising means for plotting results of the testing.

21. A system for testing an electrical device with respect to various combinations of value of N variable operating parameters to determine a range of combinations of values of the N variable operating parameters for which the device functions properly, the system comprising:
- a circuit tester connectable to an electrical device for testing the electrical device under prescribed operating conditions; and
- a computer connected to the circuit tester for controlling operation thereof, wherein the computer defines a plot region comprising a plurality of operating points each corresponding to a particular combination of values of the N variable operating parameters, causes the circuit tester to test the electrical device using the combination of values of the N variable operating parameters corresponding to the selected operating point, and, if the electrical device functions in a first manner at the selected operating point, adds all operating points of the plot region in a first relationship with respect to the selected operating point to a list of operating points to be tested.

22. The system of claim 21 wherein the computer repeats the testing, conditional adding, and selecting for all points of the list of operating points.

23. The system of claim 21 wherein the computer plots the results of the testing.

24. The system of claim 21 wherein the computer initializes a number associated with each operating point of the defined plot region to zero and, if the electrical device functions in other than the first manner at the selected operating point:
- increments the number associated with the selected operating point;
- identifies all operating points of the plot region in a first relationship with respect to the selected operating point;
- for each of the identified operating points, sets a value of the number associated therewith to a value of the number associated with the selected operating point; and
- adds the identified operating points to the list of operating points to be tested.

25. The system of claim 24 wherein, if the electrical device functions in other than the first manner at the selected operating point, the computer:
- determines, prior to incrementing, whether the number associated with the selected operating point is equal to a predetermined maximum number; and
- if the number associated with the selected operating point is equal to the predetermined maximum number, causes the identifying, assigning, and adding to be skipped with respect to the selected operating point.

26. The system of claim 21 wherein the computer, prior to the testing, determines whether the electrical device has previously been tested at the selected operating point and, if the electrical device has previously been tested at the selected operating point, omits further testing of the electrical device at the selected operating point.

27. The system of claim 21 wherein the list of operating points to be tested is implemented as a data structure selected from a group consisting of a first-in, last-out queue and a first-in, first-out stack.

28. A computer-readable medium operable with a computer to test an electrical device with respect to various combinations of values of N variable operating parameters to determine a range of combinations of values of the N variable operating parameters for which the device functions properly, the medium having stored thereon:
- instructions executable by the computer for defining a plot region comprising a plurality of operating points each corresponding to a particular combination of values of the N variable operating parameters;
- instructions executable by the computer for selecting an operating point within the plot region;
- instructions executable by the computer for testing the electrical device using the combination of values of the N variable operating parameters corresponding to the selected operating point; and
- instructions executable by the computer responsive to the electrical device functioning in a first manner at the selected operating point for adding all operating points of the plot region in a first relationship with respect to the selected operating point to a list of operating points to be tested.

29. The computer readable medium of claim 28 further having stored thereon instructions executable by the computer for repeating the testing, conditional adding, and selecting for all points of the list of operating points.

30. The computer-readable medium of claim 28 further having stored thereon instructions executable by the computer for plotting results of the testing.

31. The computer-readable medium of claim 28 further having stored thereon:
- instructions executable by the computer for initializing a number associated with each operating point of the defined plot region to zero; and
- instructions executable by the computer responsive to the electrical device functioning in other than the first manner at the selected operating point for incrementing the number associated with the selected operating point; identifying all operating points of the plot region in a first relationship with respect to the selected operating point; for each of the identified operating points, setting a value of the number associated therewith to a value of the number associated with the selected operating point; and adding the identified operating points to the list of operating points to be tested.

32. The computer-readable medium of claim 31 further having stored thereon instructions executable by the computer responsive to the electrical device functioning in other than the first manner at the selected operating point for, prior to incrementing, determining whether the number associated with the selected operating point is equal to a predetermined maximum number; and if the number associated with the selected operating point is equal to the predetermined maximum number, skipping the identifying, assigning, and adding with respect to the selected operating point.

33. The computer-readable medium of claim 28 further having stored thereon instructions executable by the computer for determining whether the electrical device has previously been tested at the selected operating point prior to the testing and means responsive to the electrical device having previously been tested at the selected operating point for omitting further testing of the electrical device at the selected operating point.

34. The computer-readable medium of claim 28 wherein the list of operating points to be tested is implemented as a data structure selected from a group consisting of a first-in, last-out queue and a first-in, first-out stack.

* * * * *